United States Patent [19]
Lee et al.

[11] Patent Number: 5,647,964
[45] Date of Patent: Jul. 15, 1997

[54] DIAMOND FILM SYNTHESIZING APPARATUS AND METHOD THEREOF USING DIRECT CURRENT GLOW DISCHARGE PLASMA ENHANCED CHEMICAL VAPOR DEPOSITION

[75] Inventors: Jae-Kap Lee; Young-Joon Baik; Kwang Yong Eun, all of Seoul, Rep. of Korea

[73] Assignee: Korea Institute of Science and Technology, Seoul, Rep. of Korea

[21] Appl. No.: 458,761

[22] Filed: Jun. 2, 1995

[51] Int. Cl.$^6$ ................................................ C23C 14/00
[52] U.S. Cl. ........................ 204/298.12; 204/298.06; 204/298.33
[58] Field of Search ............ 204/298.34, 298.06, 204/298.12, 298.08, 298.33, 298.07, 298.26, 298.23, 298.28, 192.12; 118/723 E, 723 ER, 723 MP; 156/345

[56] References Cited

PUBLICATIONS

Kazuhiro Suzuki et al., Japanese Journal of Applied Physics, 29 (1991) 153–157.
B. Singh et al., Appl. Phys. Lett. 52 (1988) 1658–1660.
J.Seigler et al., Thin Solids Films 219 (1992) 4–6.
P.J. Kung and Tzeng, J.Appl.Phys. 66 (1989) 4676–4684.

*Primary Examiner*—John Niebling
*Assistant Examiner*—Joni Y. Chang
*Attorney, Agent, or Firm*—Lowe, Price, LeBlanc & Becker

[57] ABSTRACT

An improved diamond film synthesizing apparatus and a method thereof using a direct current glow discharge plasma enhanced chemical vapor deposition advantageously providing a plurality of cathodes for forming a relatively large plasma size, which includes a reactor having an upper wall and a bottom wall; a plurality of spaced apart cathode holders half inserted into the upper wall of the reactor, arranged in a triangle when looking dowawardly over the head of the reactor; a plurality of cathode connecting rods, each of which is threadly connected to the cathode holders inside the reactor, respectively; a plurality of cathodes, each of which is threadly connected to the cathode connecting rods, respectively; an anode half inserted into the bottom wall of the reactor and having a substrate attached on the top thereof, whereby all the cathodes and the anodes are spaced apart inside the reactor by a predetermined distance; and a gas supplier connected to one side wall of the reactor having a circular gas supplying tube having a plurality of holes for injecting gas into the reactor. In addition, the diamond film synthesizing method using a direct current glow discharge plasma enhanced chemical vapor deposition comprises the methods of cutting off the heat transfer from a cathode to a cathode holder, thereby maintaining the temperature of a cathode to be within a predetermined range for a stable production of a plasma.

8 Claims, 6 Drawing Sheets

DIAMOND FILM SYNTHESIZING APPARATUS AND METHOD THEREOF USING DIRECT CURRENT GLOW DISCHARGE PLASMA ENHANCED CHEMICAL VAPOR DEPOSITION

BACKGROUND OF THE INVENTION

1. Field of the Invention

The present invention relates to a diamond film synthesizing apparatus and a method thereof using a direct current glow discharge plasma enhanced chemical vapor deposition, and in particular to an improved diamond film synthesizing apparatus and a method thereof using a direct current glow discharge plasma enhanced chemical vapor deposition advantageously providing a plurality of spaced-apart cathodes for forming a relatively large and strong plasma section, so that a high deposition rate can be obtained in large area, wherein each of the cathodes is connected to an improved cathode holders via a cathode connecting rod capable of preventing a formation of a solid carbon on the cathode, which disadvantageously affects stable production of a plasma by maintaining the temperature of the cathode at over 2100° C.

2. Description of the Conventional Art

Conventionally, a direct current glow discharge plasma enhanced chemical vapor (CVD) deposition is well known as one of typical diamond synthesizing technologies among conventional diamond synthesizing apparatuses and methods. Plasma CVD is generally classified into two methods: a low temperature plasma enhanced method and a high temperature plasma enhanced method. The low temperature plasma enhanced method comprises a hot filament CVD method and a microwave plasma enhanced CVD method. The high temperature plasma enhanced CVD method includes an arc jet plasma CVD method.

In the low plasma enhanced method, the desired deposition rate can be obtained; meanwhile, the deposition rate slows down to 1 μm/h, so it is difficult to increase the deposition rate due to the limited deposition rate. In the high temperature plasma enhanced CVD method, the deposition rate is relatively fast up to a 10–100 μm/h; meanwhile, the deposition rate is limited within a diameter of 2–3 cm. In addition, there is a big problem in obtaining a uniform diamond film.

Meanwhile, in case of the direct current glow discharge plasma enhanced CVD method, since the characteristic of a plasma is similar to the higher plasma enhanced CVD method, a high deposition rate of 70 μm/h can be obtained, and the construction thereof is simple, and the cost of electric power is low since it uses a direct current electric power source which is much cheaper than a microwave or a high frequency current power source.

Referring to FIG. 1, there is shown a conventional direct current glow discharge plasma enhanced CVD apparatus. The construction of the conventional direct current glow discharge plasma enhanced CVD apparatus will now be explained.

To begin with, there is provided a sealed cylindrical reactor 1 having an upper wall 1a and a lower wall 1b. A cathode 2 is half inserted into the upper wall 1a of the reactor 1 in a form that one end of which is extended into the reactor 1 and the other end of which is externally connected to a power supplier 3, one end of which being connected to the mound. An anode 4 is also half inserted into the lower wall 1b of the reactor 1, the upper portion of which is extended into the reactor 1 and the bottom portion of which is externally connected to the ground. Here, a substrate 5 is attached on the top of the anode 4.

Meanwhile, a pressure gauge 6 is disposed on a predetermined portion of the reactor 1. A gas supplier 7 is disposed on a predetermined portion of the reactor 1 for supplying gas thereinto. A vacuum pump 8 is disposed on a predetermined portion of the reactor 1 for creating a vacuum inside of the reactor 1.

Referring to FIG. 2A, there is shown a conventional cathode. The upper wall of a cathode 2 is cooled by water 10 flowing from an inlet port 9a to an outlet port 9b. Referring to FIG. 2B, there is shown a graph showing a temperature variation along a cathode. As shown therein, the heat generated at the bottom of the cathode 2 is transferred the top thereof. That is, a temperature of 2100° C. at the bottom thereof gradually tapers down to room temperature level as the heat is transferred toward the top thereof.

The operation of the conventional direct current glow discharge plasma enhanced CVD apparatus will now be explained with reference to FIG. 1 and FIGS. 2A and 2B.

To begin with, the inside of the reactor 1 is evacuated by the vacuum pump 8; thereafter and the inside of the reactor 1 is charged with a gas source supplied by the gas supplier 7. In the above state, a direct current voltage is supplied to both the cathode 2 and the anode 4; thereafter, a plasma stream is generated between the cathode 2 and the anode 3, whereby a diamond synthesizing operation is performed on the surface of the substrate 6.

Generally, in the diamond synthesizing operation using a direct current glow discharge plasma enhanced CVD method, a cathode plays a most important key role for generating a stable plasma stream in a reactor. In addition, a cathode is commonly made of a metal, having a relatively high melting temperature, such as Mo, W, Ta, which are generally manufactured in a shape of a rod or filament. When a cathode made of such a metal is used, the temperature at the end portion of the cathode reaches up to about 2100° C. At this time, a solid carbon, which is generally formed at a temperature of 1900° C., is formed at the intermediate portion of the cathode because the temperature of 2100° C. generated at the end portion of the cathode becomes a range of 1900° C.–2100° C. thereat. As the synthesizing operation is continued, the solid carbon gradually builds up, so that in the long run the formation of the solid carbon reaches to the end portion of the cathode, thereby covering the end portion of the cathode and thus the desired plasma can not be obtained. In addition, since the formation of the solid carbon builds up unevenly on the circumferential surface of the cathode and the end portion thereof, the current flow is biased, so that the cathode is partially heated and, thus, an arc is generated between the cathode and the substrate, discontinuing deposition of diamond.

Meanwhile, in a conventional current glow discharge plasma enhanced CVD method for synthesizing diamond, one cathode 2 is used as shown in FIG. 1. In this case, to increase the deposition area for generating the desired amount of plasma, the size of a cathode should be increased; however, as the cathode area increases, it is difficult to maintain the distance between the cathode and the substrate constant at every point. This makes the plasma shift to a position where the distance between the cathode and the substrate is minimum. Such a plasma shift makes a thickness of a diamond film uneven. Moreover, the deposition rate of diamond film is about 5 μm/h, relatively low.

In addition, current density, a key element in synthesizing speed and film quality, is limited to a predetermined level, therefore, the larger the deposition area, the lower the deposition rate and the quality.

SUMMARY OF THE INVENTION

Accordingly, it is an object of the present invention to provide a diamond film synthesizing apparatus and a method thereof using a direct current glow discharge plasma enhanced chemical vapor deposition, which overcomes the problems encountered in the conventional diamond film synthesizing apparatus and a method thereof.

It is another object of the present invention to provide an improved diamond film synthesizing apparatus and a method thereof using a direct current glow discharge plasma enhanced chemical vapor deposition advantageously providing a plurality of spaced-apart cathodes for forming a relatively large and strong plasma section, so that a high deposition rate and large deposition area can be obtained, wherein each of the cathodes is connected to an improved cathode holders via a cathode connecting rod capable of preventing a formation of a solid carbon on the cathode, which disadvantageously affects stable production of a plasma by maintaining the temperature of the cathode over 2100° C.

To achieve the above objects, there is provided a diamond film synthesizing apparatus using a direct current glow discharge plasma enhanced chemical vapor deposition, which includes a reactor having an upper wall and a bottom wall; a plurality of spaced apart cathode holders half inserted into the upper wall of the reactor, arranged in a triangle when looking dowawardly over the head of the reactor; a plurality of cathode connecting rods, each of which is threadedly connected to the cathode holders inside the reactor, respectively; a plurality of cathodes, each of which is threadedly connected to the cathode connecting rods, respectively; an anode half inserted into the bottom wall of the reactor and having a substrate attached on the top thereof, whereby all the cathodes and the anodes are spaced apart inside the reactor by a predetermined distance; and a gas supplier connected to one side wall of the reactor having a circular gas supplying tube having a plurality of holes for injecting gas into the reactor. In addition, the diamond film synthesizing method using a direct current glow discharge plasma enhanced chemical vapor deposition comprises cutting off the heat transfer from a cathode to a cathode holder, thereby maintaining the temperature of a cathode to be within a predetermined range for a stable production of a plasma.

DETAILED DESCRIPTION OF THE INVENTION

Figure 1:
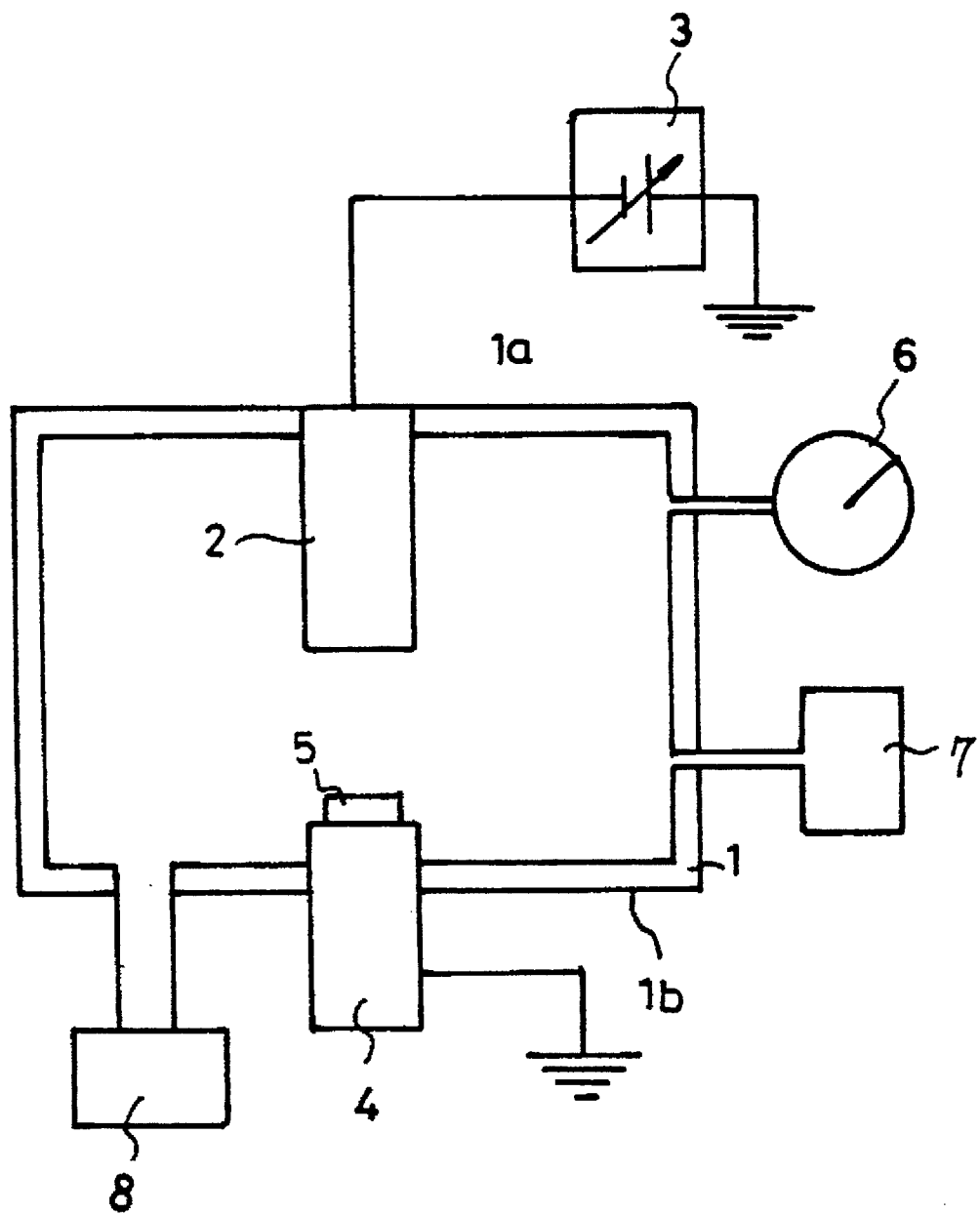
FIG. 1 is a schematic diagram of a conventional diamond synthesizing apparatus using a direct current glow discharge plasma CVD method.
Figures 2A, 2B:
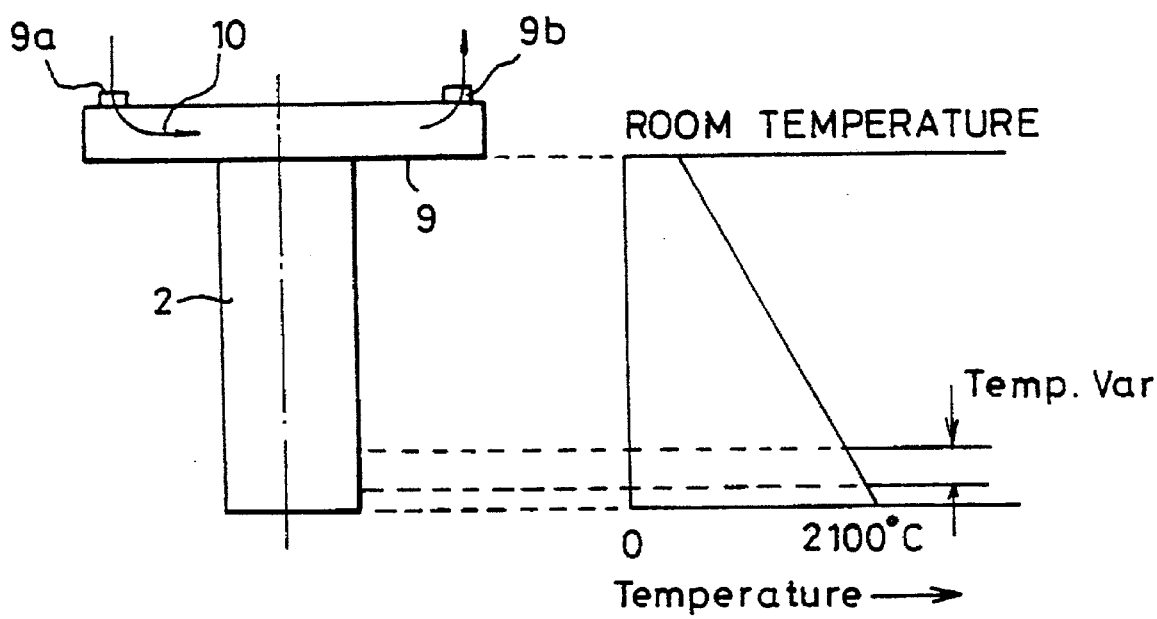
FIG. 2A is a schematic cross-sectional diagram of a cathode of a conventional diamond synthesizing apparatus.
FIG. 2B is a graph showing a temperature variation along a cathode of FIG. 2A of a conventional diamond synthesizing apparatus.

The construction of a direct current glow discharge plasma enhanced CVD diamond synthesizing apparatus according to a first embodiment of the present invention will now be explained with reference to FIGS. 3 and 4 and FIGS. 5A and 5B.

To begin with, the direct current glow discharge plasma enhanced CVD diamond synthesizing apparatus is provided with a reactor 100 having an upper wall 100a and a bottom wall 100b. A plurality of spaced-apart cathode holders 110 are sealingly half inserted into the upper wall 100a, respectively. Here, the spaced-apart cathode holders 110 are arranged in a triangle on the surface of the upper wall 100a of the reactor 100 when looking downwardly or upwardly from over the head thereof. Each end of cathode holders 110 is connected with a cathode 120 through a cathode connecting rod 130, respectively. Here, each top of the cathode holders 110 is connected to a direct current voltage suppliers 140. Each of the direct current voltage suppliers 140 is connected to a controller 150, respectively. Here, the cathode 120 is made of high temperature metal such as Ta, W or a carbide such as WC, TaC, $Mo_2C$, TiC, which inhibits the spalling phenomenon at the cathode.

Meanwhile, an anode 160 is half inserted into the bottom wall 100b of the reactor 100. Here, the bottom of the anode 160 is connected to one of the direct current voltage suppliers 140. On the top of the anode 160 is disposed a substrate 170. Therefore, the cathodes 120 and the substrate 160 are spaced apart by a predetermined distance inside the reactor 100.

In addition, a vacuum pump 180 is connected to a predetermined portion of the bottom wall 100b of the reactor 100 for evacuating the inside of the reactor 100. Moreover, a gas supplier 190 is connected to a predetermined portion of a side wall of the reactor 100 and includes a circular tube 200 disposed inside the reactor 100 and having a plurality of holes (not shown) which are formed on the circumferential surface thereof in order to charge gas into the reactor 100. In the drawings, reference numeral 210 denotes a stream of plasma formed between the cathodes 120 and the substrate 170.

Figure 4:
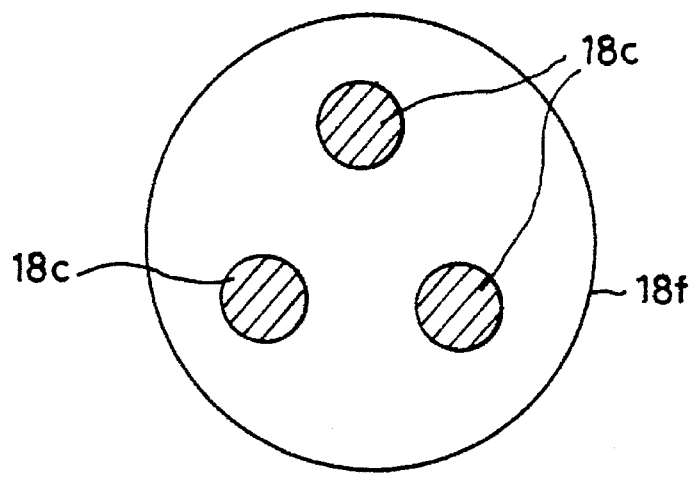
FIG. 4 is a bottom view taken along line IV—IV of FIG. 3, wherein cross-sectional views of each cathode are arranged in a triangle.

Meanwhile, FIG. 4 shows the cathodes 120, ends of which are substantially within a stream of plasma in a triangle.

Figures 5A, 5B:
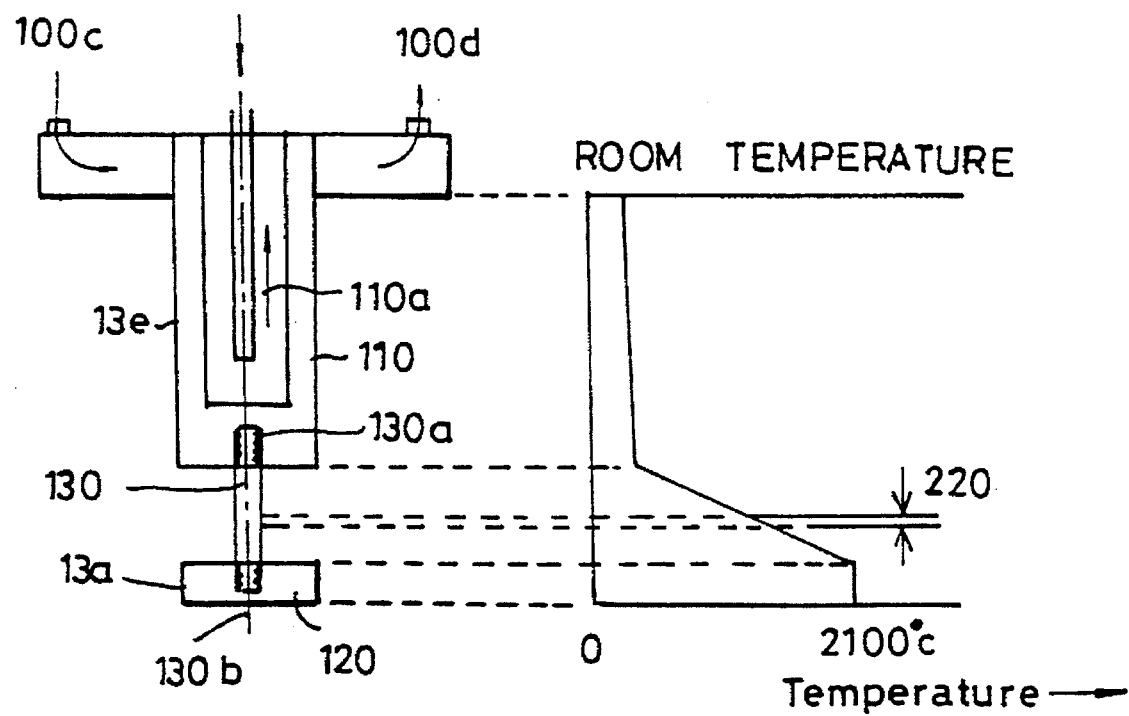
FIG. 5A is a cross-sectional view showing a cathode of a diamond synthesizing apparatus according to a first embodiment of the present invention.
FIG. 5B is a graph showing a temperature variation along a cathode of FIG. 5B according to a first embodiment of the present invention.

FIG. 5A shows a cathode 120 adapted in the first embodiment of the diamond film synthesizing apparatus. As shown therein, there is provided a cathode holder 110 having a downwardly extending hole 110a formed within the cathode holder 110 for charging cooling water therein and having a cooling water inlet port 100c and a cooling water outlet port 100d, whereby cooling water flows from the cooling water inlet port 110c, the hole 110a, and the cooling water outlet port 100d. A cathode 120 is threadedly connected to the cathode holder 110 by a cathode connecting rod 130 having an upper threadedly portion 130a for threadly connecting the cathode holder 110 and a lower threadedly portion 130b for threadly connecting a cathode 120.

FIG. 5B is a graph showing a temperature variation along a cathode holder 110, a cathode connecting rod 130, and a cathode 120. As shown therein, the temperature is the highest at the end of a cathode 120 with 2100° C. As the heat is transferred toward the cathode holder 110, the temperature becomes room temperature. However, at the cathode connecting rod 130, the temperature level is sharply decreased. That is, as previously described, solid carbon is generally formed at the temperature of below 2100° C., so that the solid carbon is formed at the cathode connecting rod 130, having a solid carbon formation area 220.

The construction of a direct current glow discharge plasma enhanced CVD diamond synthesizing apparatus according to a second embodiment of the present invention will now be explained with reference to FIGS. 6a and 6B.

The second embodiment has the same construction as the first embodiment except for the construction of the cathode, so for the same construction as the first embodiment, the same reference numerals are given.

The cathode 320 is substantially shaped in a semicircular having a threaded engaging portion 320b formed on the curved portion thereof. Here, the flat portion thereof faces the anode 160.

The construction of a direct current glow discharge plasma enhanced CVD diamond synthesizing apparatus according to a third embodiment of the present invention will now be explained with reference to FIGS. 7A and 7B.

The third embodiment has the same construction as the first embodiment except for the construction of the cathode, so for the same construction as the first embodiment, the same reference numerals are given.

The cathode 420 has a threaded engaging hole 420b formed on the top thereof and a plurality of spaced-apart holes 420a vertically extending within the cathode 420.

Figure 8A:
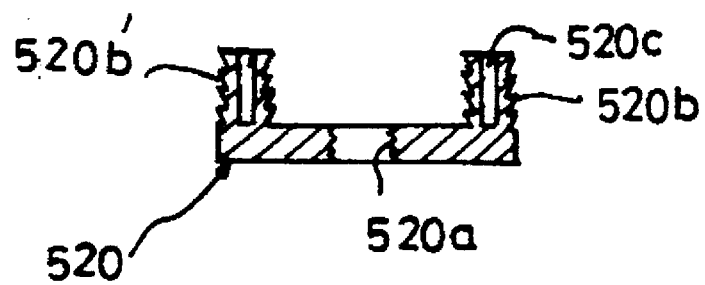
FIG. 8A is a cross-sectional view showing a cathode of a diamond synthesizing apparatus according to a fourth embodiment of the present invention.
Figure 8B:
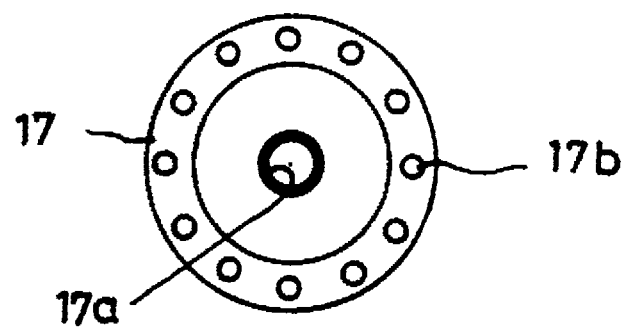
FIG. 8B is a bottom view showing a cathode of FIG. 8A of a diamond synthesizing apparatus according to a fourth embodiment of the present invention.

The construction of a direct current glow discharge plasma enhanced CVD diamond synthesizing apparatus according to a fourth embodiment of the present invention will now be explained with reference to FIGS. 8A and 8B.

The fourth embodiment has the same construction as the first embodiment except for the construction of the cathode, so for the same construction as the first embodiment, the same reference numerals are given.

The cathode 520 includes a threaded engaging hole 520a formed on the central portion thereof and a ring-shaped member 520b integrally formed with the cathode 520 and having a predetermined outer diameter and inner diameter. Here, the ring-shaped member 520b includes a plurality of holes 520c downwardly extending within the ring-shaped member 520b. In addition, the ring-shaped member 520 includes a threaded portion 520b formed on the inner circumferential surface thereof and the outer circumferential surface thereof.

The operations of a direct current glow discharge plasma enhanced CVD diamond synthesizing apparatus according to the first embodiment through the fourth embodiment of the present invention will now be explained with reference to FIGS. 3, 4, 5A, 5B, 6A, 6B, 7A, 7B, 8A, 8B.

To begin with, gas is charged into the reactor 100 by the gas supplier 190 through the circular tube 190. Thereafter, when the electric power is supplied to the plurality of the cathodes 120 and the anode 160, a predetermined stream of plasma is formed between the cathodes 120 and the anode 160 by a chemical reaction between gas injected from the gas supplier 190 and a predetermined electric power supplied to both the cathode 120 and the anode 160. Through above stated operation, a desired diamond film is deposited on the substrate 170.

Next, the preferred embodiments of methods of synthesizing diamond film using the above described apparatus will now be explained.

EXAMPLE I

Under the first embodiment of the diamond film synthesizing apparatus, a diamond synthesizing operation is conducted under conditions comprising a cathode made of Tantalum with an outer diameter of 12 mm and a thickness of 5 mm, a voltage level is 620 V, a current level is 3.3 A, a gas composition 4% of $CH_4$ a gas pressure 300 mbar, a gas flow rate is 200 sccm, a substrate diameter of 16 mm, the distance between the cathode and anode is 25 mm, and a measured substrate temperature ranging from 1180° through 1250° C., which is expected to be about 200° C. higher than real temperature. As a result, the diameter of a plasma of about 20 mm was obtained, the temperature of a cathode was arranged at 2130° through 2150° C. The thickness of a diamond film of 1.3 mm was produced at a deposition rate of 47 μm per hour. In this case, solid carbon having a width of 3 mm was formed at the cathode connecting rod.

EXAMPLE II

Under the same conditions as the Example I, the diamond synthesizing operation was conducted except for the composition of gas of 2% of methane and 0.2% of oxygen and 97.8% of hydrogen. As a result, the temperature of cathodes was 2110° to 2120° C., which is slightly lower than the first embodiment. The deposition rate was 25 μm per hour for forming a transparent white diamond having a thickness of 300 μm.

EXAMPLE III

Under the construction of the third and fourth embodiments of FIGS. 7A, 7B, 8A, 8B, the synthesizing operation was conducted in 4% of $CH_4$ and 96% of $H_2$. In this case, the outer diameter of each cathode was 20 mm, and the thickness thereof was 5 mm. The substrate size 30 mm, the voltage level 980 V, the current level 5.0 A, and the distance between the cathode and the anode 35 mm. In this case, the temperature of each cathode was lower than that of the first embodiment. The deposition rate was 25 μm for forming a diamond having 1.0 mm in thickness.

EXAMPLE IV

Under the construction of the first embodiment of FIG. 5A, the synthesizing operation was conducted. In this case, the cathode was made of a tungsten carbide. The remaining conditions were the same as Example I, under which there was no significant difference except that even for 300 hours operation there was no peel-off phenomenon.

EXAMPLE V

Figure 7A:
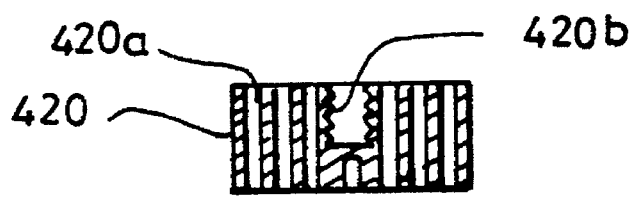
FIG. 7A is a cross-sectional view showing a cathode of a diamond synthesizing apparatus according to a third embodiment of the present invention.
Figure 7B:
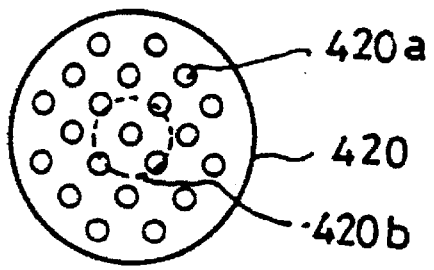
FIG. 7B is a bottom view showing a cathode of FIG. 7A of a diamond synthesizing apparatus according to a third embodiment of the present invention.

Under the construction of the third embodiment of FIGS. 7A and 7B, the synthesizing operation was conducted in 4% of $CH_4$ and 96% of $H_2$. In this case, the cathode was made of Tantalum carbide having an outer diameter of 16 mm and a thickness of a 5 mm. In addition, the substrate was 30 mm, the current level was 4.5 A, and the distance between the cathode and the anode was 40 mm. As a result, the temperature of each cathode was 2100° C. to 2120° C. The synthesizing speed was 23 μm for forming a diamond film having a 1.1 mm thickness.

EXAMPLE VI

Figure 6A:
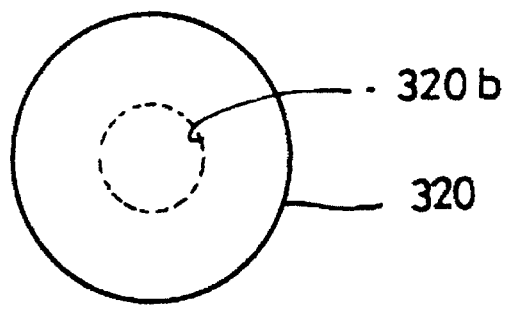
FIG. 6A is a cross-sectional view showing a cathode of a diamond synthesizing apparatus according to a second embodiment of the present invention.
Figure 6B:
FIG. 6B is a bottom view showing a cathode of FIG. 6A of a diamond synthesizing apparatus according to a second embodiment of the present invention.

Under the construction of the second embodiment of FIGS. 6A and 6B, the synthesizing operation was conducted in 3% of $CH_4$ and 97% of $H_2$. In this case, the cathode was made of Tantalum having an outer diameter of 16 mm and a thickness of a 5 mm. In addition, the size of a substrate was 50 mm, the current level was 6.5 A, and the distance between the cathode and the anode was 50 mm. As a result, the temperature of each cathode was 2170° C. to 2190° C. The synthesizing speed was 5 μm for forming a diamond film having a thickness of 1.1 mm.

EXAMPLE VII

Figure 3:
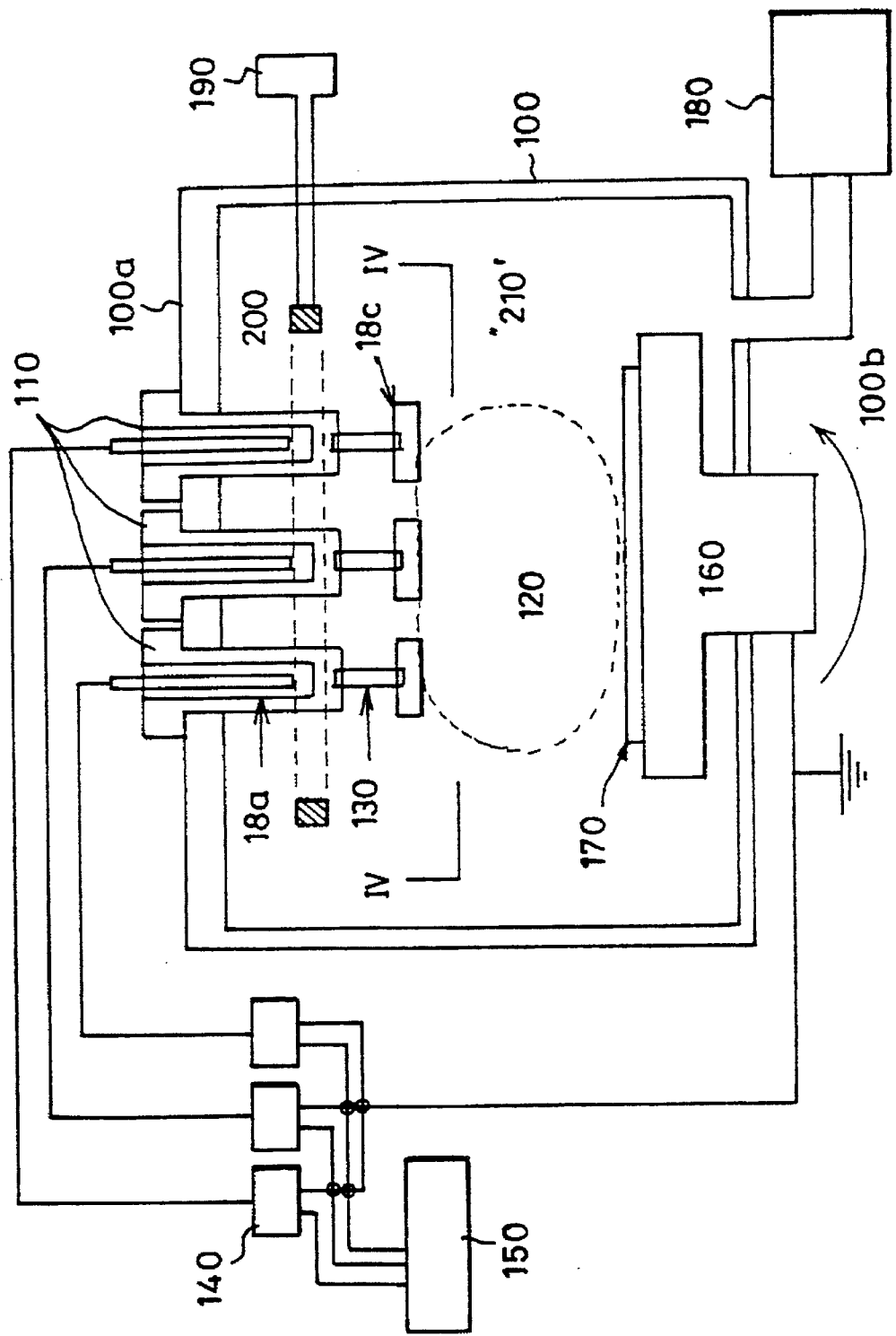
FIG. 3 is a schematic view of a diamond synthesizing apparatus according to the present invention.

Under the construction of the second embodiment of FIGS. 6A and 6B, the synthesizing operation was conducted in three cathode system of FIG. 3. In this case, each cathode was made of Tantalum having an outer diameter of 10 mm and a thickness of a 5 mm. In addition, the size of a substrate was 100 mm, the current level was 3 A, the voltage level was 600 V, and the distance between the cathode and the anode was 40 mm. The gas composition was 3% of Methane, 0.3% of Oxygen, and 96.7% of Hydrogen. The remaining conditions were the same as the example I. As a result, the size of plasma was 120 mm in a diameter, and an even diamond film was formed on the substrate. In this case the synthesizing operation was conducted for 30 hours, and the thickness of diamond was 1.0 mm.

As described above, the direct current glow discharge plasma enhanced CVD diamond synthesizing apparatus and methods thereof are capable of a relatively long duration diamond synthesizing operation by eliminating solid carbon formation by maintaining over 2100° C. at the end of a cathode. In addition, since the cathodes are constructed in a triangle shape within a stream of plasma, a more speedy synthesizing operation can be obtained. Moreover, since the cathode is made of a metal or a carbide having a relatively high melting temperature, a spalling phenomenon can advantageously be prevented, so that cathode life is increased. In addition, the use of plural cathodes increase and stabilizes the large area of plasma for large area deposition of diamond.

What is claimed is:

1. A diamond film synthesizing apparatus using a direct current glow discharge plasma enhanced chemical vapor deposition, comprising:

a reactor having a head, an upper wall and a bottom wall;

a plurality of spaced apart cathode holders inserted into said upper wall of said reactor;

a plurality of cathode connecting rods, each cathode connecting rod connected at a first end thereof to a cathode holder and connected at a second end thereof to a cathode inside the reactor;

an anode inserted into said bottom wall of the reactor and having a substrate attached on a top surface thereof, whereby all the cathodes are spaced apart from the anode inside the reactor; and a gas supplier connected to one side wall of the reactor having a circular gas supplying tube with a plurality of holes for injecting gas into the reactor.

2. The apparatus of claim 1, wherein said each of the cathode holders is electrically connected to plurality of a direct current voltage suppliers, respectively.

3. The apparatus of claim 1, wherein said anode is electrically connected to a direct voltage supplying apparatus.

4. The apparatus of claim 1, wherein an upper surface a cathode has a semi-circular and includes a threaded engaging groove for receiving one end of one of said cathode connecting rods.

5. The apparatus of claim 1, wherein a cathode includes a plurality of holes vertically extending within the cathode and a threaded engaging groove for receiving one end of one of said cathode connecting rods.

6. The apparatus of claim 1, wherein a cathode includes a ring-shaped member having an outer diameter and an inner diameter.

7. The apparatus of claim 6, wherein said ring-shaped member includes a plurality of holes vertically extending within the ring-shaped member and a threaded portion formed on an outer circumferential surface and an inner circumferential surface of the ring-shaped member.

8. The apparatus according to claim 1, wherein each cathode connecting rod is threadedly connected to a cathode holder and threadedly connected to a cathode.

* * * * *